(12) United States Patent
Horikoshi et al.

(10) Patent No.: US 7,553,901 B2
(45) Date of Patent: Jun. 30, 2009

(54) RTV SILICONE RUBBER COMPOSITION FOR ELECTRIC AND ELECTRONIC PART PROTECTION, CIRCUIT BOARDS, SILVER ELECTRODES, AND SILVER CHIP RESISTORS

(75) Inventors: Jun Horikoshi, Annaka (JP); Tsuneo Kimura, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 526 days.

(21) Appl. No.: 11/279,955

(22) Filed: Apr. 17, 2006

(65) Prior Publication Data

US 2006/0257672 A1 Nov. 16, 2006

(30) Foreign Application Priority Data

May 13, 2005 (JP) ............................. 2005-141131

(51) Int. Cl.
*C08L 83/00* (2006.01)
*C08L 83/06* (2006.01)
*C08G 77/04* (2006.01)

(52) U.S. Cl. ..................... 524/588; 524/266; 524/268; 528/34

(58) Field of Classification Search .................. 428/447
See application file for complete search history.

(56) References Cited

U.S. PATENT DOCUMENTS

| | | | | |
|---|---|---|---|---|
| 4,339,563 A | * | 7/1982 | Takago et al. | 528/14 |
| 4,514,529 A | * | 4/1985 | Beers et al. | 523/200 |
| 5,082,596 A | * | 1/1992 | Fukuda et al. | 252/511 |
| 5,319,050 A | * | 6/1994 | Kimura et al. | 528/12 |
| 5,705,586 A | * | 1/1998 | Sato et al. | 528/15 |
| 5,705,591 A | * | 1/1998 | Matsuda et al. | 528/42 |
| 6,008,284 A | * | 12/1999 | Nylund et al. | 524/425 |
| 6,040,362 A | * | 3/2000 | Mine et al. | 523/212 |
| 6,235,832 B1 | * | 5/2001 | Deng et al. | 524/525 |
| 6,734,250 B2 | * | 5/2004 | Azechi et al. | 524/588 |
| 6,812,280 B2 | * | 11/2004 | Horikoshi et al. | 524/588 |
| 6,844,393 B2 | * | 1/2005 | Goto et al. | 524/588 |
| 6,939,925 B2 | * | 9/2005 | Sakamoto et al. | 525/477 |
| 7,094,822 B2 | * | 8/2006 | Sagal et al. | 524/404 |
| 2002/0010251 A1 | * | 1/2002 | Muramatsu et al. | 524/493 |
| 2003/0087448 A1 | * | 5/2003 | Abe et al. | 436/73 |
| 2003/0105206 A1 | | 6/2003 | Hara et al. | |
| 2003/0153672 A1 | * | 8/2003 | Sakamoto et al. | 524/588 |
| 2003/0195322 A1 | * | 10/2003 | Horikoshi et al. | 528/10 |
| 2003/0211339 A1 | * | 11/2003 | Araki et al. | 428/447 |
| 2003/0212197 A1 | * | 11/2003 | Sakamoto et al. | 524/588 |
| 2003/0216536 A1 | * | 11/2003 | Levandoski et al. | 528/10 |
| 2004/0002571 A1 | * | 1/2004 | Sakamoto et al. | 524/588 |
| 2004/0242762 A1 | * | 12/2004 | Horikoshi et al. | 524/588 |
| 2005/0059772 A1 | | 3/2005 | Horikoshi et al. | |
| 2006/0135687 A1 | * | 6/2006 | Fukui | 524/588 |
| 2006/0205237 A1 | * | 9/2006 | Kodama et al. | 438/790 |

FOREIGN PATENT DOCUMENTS

| | | |
|---|---|---|
| JP | 2003-96301 | 4/2003 |
| JP | 2004-149611 | 5/2004 |
| JP | 2005-113115 | 4/2005 |

\* cited by examiner

*Primary Examiner*—Randy Gulakowski
*Assistant Examiner*—Robert Loewe
(74) *Attorney, Agent, or Firm*—Oblon, Spivak, McClelland, Maier & Neustadt, P.C.

(57) ABSTRACT

RTV silicone rubber compositions are provided comprising (A) an organopolysiloxane, (B) an organosilicon compound or partial hydrolytic condensate thereof, and (C) a non-aromatic amino-bearing compound. The compositions, when electric and electronic parts having a copper, silver or other metal portion on their surface are encapsulated or sealed therewith, can prevent or retard the parts from corrosion with sulfur-containing gas.

16 Claims, No Drawings

RTV SILICONE RUBBER COMPOSITION FOR ELECTRIC AND ELECTRONIC PART PROTECTION, CIRCUIT BOARDS, SILVER ELECTRODES, AND SILVER CHIP RESISTORS

CROSS-REFERENCE TO RELATED APPLICATION

This non-provisional application claims priority under 35 U.S.C. §119(a) on Patent Application No. 2005-141131 filed in Japan on May 13, 2005, the entire contents of which are hereby incorporated by reference.

TECHNICAL FIELD

This invention relates to room temperature-curable silicone rubber compositions suited for the protection of electric and electronic parts. More particularly, it relates to RTV silicone rubber compositions suited for the protection of electric and electronic parts, especially silver-containing precision electronic parts such as silver electrodes and silver chip resistors, for preventing or retarding the parts from corrosion with sulfur-containing gases. It also relates to circuit boards, silver electrodes, and silver chip resistors. It is noted that the term "room temperature-curable" is often referred to as RTV as it is synonymous with room temperature-vulcanizable.

BACKGROUND ART

Silicone rubber compositions are traditionally used in the encapsulation and sealing of electric and electronic parts for the purpose of preventing or retarding corrosion and degradation thereof. When electric and electronic parts are exposed to sulfur-containing gases such as sulfur gas and sulfur dioxide gas, conventional silicone rubbers fail to prevent or retard the sulfur-containing gas from reaching the electric and electronic parts. In particular, they are not effective for preventing or retarding corrosion of metal parts.

As modern devices comprising precision electronic parts are being reduced in size and power, challenges are made to a transition from copper to silver for the material of electrodes and chip resistors, a reduction in thickness of electrodes, and a narrowing of the gap between electrodes. Thus electronic parts become more susceptible to corrosion with sulfur-containing gas.

JP-A 2003-096301 (U.S. Ser. No. 10/252,595) and JP-A 2005-113115 disclose silicone rubber compositions for use in the encapsulation and sealing of electric or electronic parts which are obtained by adding 0.5 to 90% by weight or 0.01 to 0.5% by weight of a metal powder which is sulfidable with sulfur-containing gas to an organopolysiloxane compound. The compositions are effective for preventing or retarding the sulfur-containing gas from reaching the electric or electronic parts. The silicone rubber compositions with high loadings of metal powder, however, have the tendency that metal particles agglomerate locally, with the probable risks of short-circuiting between electrodes and reducing insulation resistance. On the other hand, the compositions with limited loadings of metal powder have the drawback that their effect does not last long. When the composition is stored for a long term, the metal powder can settle down due to a difference in density between the metal powder and the organopolysiloxane. There have been developed no silicone rubber compositions having a low viscosity enough to coat.

JP-A 2004-149611 describes that benzotriazole or derivatives thereof are added to a silicone rubber composition for restraining electric and electronic parts from corrosion with sulfur-containing gas and from electrolytic corrosion by migration. However, the amino group of these aromatic amino-bearing compounds is less active and thus less effective in restraining electric and electronic parts from corrosion with sulfur-containing gas and from electrolytic corrosion by migration.

SUMMARY OF THE INVENTION

An object of the invention is to provide RTV silicone rubber compositions suited for the protection (specifically, encapsulation or sealing) of electric and electronic parts, which when electric and electronic parts are encapsulated or sealed with the silicone rubber, can prevent or retard the parts from corrosion with sulfur-containing gas while avoiding short-circuiting between electrodes and a lowering of insulation resistance. Another object is to provide circuit boards, silver electrodes, and silver chip resistors.

The inventor has found that the above-mentioned problems are overcome by adding to an RTV silicone rubber composition a non-aromatic amino-bearing compound, preferably a non-aromatic compound having at least two amino groups in a molecule, more preferably a non-aromatic compound having at least one primary amino group and at least one secondary or electronic parts, especially silver electrodes or silver chip resistors are encapsulated or sealed with this RTV silicone rubber composition in the cured state, the amine compound in the cured composition acts in a unique fashion to prevent or retard the electric and electronic parts from corrosion, so that the resultant electric and electronic parts are free from short-circuiting between electrodes or a lowering of insulation resistance.

Accordingly, the present invention provides a room temperature-curable silicone rubber composition comprising (A) 100 parts by weight of an organopolysiloxane having the general formula (1):

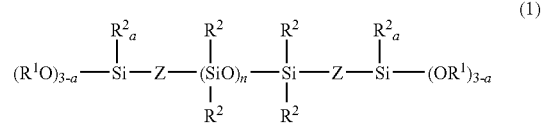

wherein $R^1$ is hydrogen or a substituted or unsubstituted monovalent hydrocarbon group, $R^2$ is a substituted or unsubstituted monovalent hydrocarbon group, Z is an oxygen atom or divalent hydrocarbon group, a is 0, 1 or 2, and n is an integer of at least 10, (B) 1 to 50 parts by weight of an organosilicon compound having the formula:

$$R^3_b SiX_{4-b}$$

wherein $R^3$ is substituted or unsubstituted monovalent hydrocarbon group, X is a hydrolyzable group, and b is 0, 1 or 2, or a partial hydrolytic condensate thereof, and (C) 0.1 to 20 parts by weight of a non-aromatic amino-bearing compound.

Also contemplated herein are a circuit board having mounted thereon an electric or electronic part encapsulated with the cured composition; a silver electrode sealed with the cured composition; and a silver chip resistor sealed with the cured composition.

BENEFITS OF THE INVENTION

When an electric or electronic part having a copper, silver or other metal portion on at least a part of its surface, typically a silver electrode or silver chip resistor is sealed with the RTV silicone rubber composition in the cured state, the cured composition prevents the electric or electronic part from corrosion with sulfur-containing gas.

DESCRIPTION OF THE PREFERRED EMBODIMENTS

Component A

Component (A) is a base polymer of the RTV silicone rubber composition of the invention. It is an organopolysiloxane having the general formula (1):

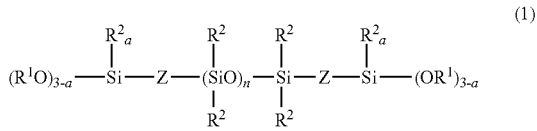

wherein $R^1$ is hydrogen or a substituted or unsubstituted monovalent hydrocarbon group, $R^2$ is a substituted or unsubstituted monovalent hydrocarbon group, Z is an oxygen atom or divalent hydrocarbon group, a is 0, 1 or 2, and n is an integer of at least 10.

Specifically, $R^1$ is selected from hydrogen and substituted or unsubstituted monovalent hydrocarbon groups, typically having 1 to 6 carbon atoms, preferably 1 to 4 carbon atoms, for example, alkyl groups such as methyl, ethyl and propyl; cyano-hydrocarbon groups such as 2-cyanoethyl, 3-cyanopropyl, and 2-cyanobutyl; allyl and isopropenyl. When a is equal to 0 or 1, monovalent hydrocarbon groups are preferred, with methyl and ethyl being more preferred. When a is equal to 2, hydrogen is preferred.

$R^2$ is selected from substituted or unsubstituted monovalent hydrocarbon groups, typically having 1 to 15 carbon atoms, preferably 1 to 10 carbon atoms, for example, alkyl groups such as methyl, ethyl, propyl, isopropyl, butyl, 2-ethylbutyl and octyl; cycloalkyl groups such as cyclohexyl and cyclopentyl; alkenyl groups such as vinyl and allyl; aryl groups such as phenyl, tolyl, xylyl, naphthyl, biphenylyl and phenanthryl; aralkyl groups such as benzyl and phenylethyl; halogenated hydrocarbon groups such as chloromethyl, trichloropropyl, trifluoropropyl, bromophenyl and chlorocyclohexyl; and cyano-hydrocarbon groups such as 2-cyanoethyl, 3-cyanopropyl, and 2-cyanobutyl. Of these, methyl, vinyl, phenyl and trifluoropropyl are preferred, with methyl being most preferred.

Z is typically an oxygen atom or an alkylene group of 1 to 12 carbon atoms, preferably 1 to 10 carbon atoms, such as methylene, ethylene or propylene. Inter alia, oxygen and ethylene are preferred.

In formula (1), n is an integer of 10 or greater, and typically such an integer that the organopolysiloxane has a viscosity at 23° C. of greater than or equal to 25 mPa-s, preferably in a range of 100 to 1,000,000 mPa-s, and more preferably in a range of 500 to 200,000 mPa-s.

Component B

Component (B), which serves as a curing agent, is a silane having at least two hydrolyzable groups in a molecule, represented by the following formula, or a hydrolytic condensate thereof.

Herein, $R^3$ is substituted or unsubstituted monovalent hydrocarbon group, preferably having 1 to 10 carbon atoms, more preferably 1 to 8 carbon atoms, for example, alkyl, alkenyl or aryl group, preferably methyl, ethyl, propyl, vinyl or phenyl. X is a hydrolyzable group, and b is 0, 1 or 2. Examples of hydrolyzable groups represented by X include alkoxy groups such as methoxy, ethoxy and butoxy; ketoxime groups such as dimethylketoxime and methylethylketoxime; acyloxy groups such as acetoxy; alkenyloxy groups such as isopropenyloxy and isobutenyloxy; amino groups such as N-butylamino and N,N-diethylamino; and amide groups such as N-methylacetamide.

The amount of the curing agent (B) compounded is 1 to 50 parts by weight per 100 parts by weight of the hydroxyl- or organoxy-end-capped organopolysiloxane (A). On this basis, less than 1 pbw of the curing agent fails to achieve sufficient crosslinking and hence to form a composition having desired rubber elasticity whereas more than 50 pbw provides an increased shrinkage factor upon curing and results in degraded mechanical properties. Preferably the curing agent is added in an amount of 3 to 20 parts by weight.

Component C

Component (C) is a non-aromatic amino-bearing compound. Typically it comprises at least one non-aromatic amino-bearing compound selected from among propanediamine, 1,2-diaminocyclohexane, 3-aminopropyltriethoxysilane, N-(2-aminoethyl)-3-aminopropyltrimethoxysilane, N'-[3-(trimethoxysilyl)-propyl]diethylenetriamine, tris(2-aminoethyl)amine, and the like, with combinations comprising at least one of the foregoing amino-bearing compounds being also useful. It is preferably a non-aromatic compound having at least two amino groups in a molecule, and more preferably a non-aromatic compound having at least one primary amino group and at least one secondary or tertiary amino group in a molecule, examples of which include N-(2-aminoethyl)-3-aminopropyltrimethoxysilane, N'-[3-(trimethoxysilyl)-propyl]diethylenetriamine, and tris (2-aminoethyl)amine.

The amount of component (C) compounded is 0.1 to 20 parts by weight, preferably 0.1 to 10 parts by weight per 100 parts by weight of component (A). Outside the range, less amounts of component (C) fail to achieve the desired effect whereas excessive amounts cause under-cure of the silicone composition.

Cure catalyst

The silicone rubber composition of the invention is of the condensation cure type. In the silicone rubber composition of the condensation cure type, a cure catalyst is generally used. Suitable cure catalysts include alkyltin ester compounds such as dibutyltin diacetate, dibutyltin dilaurate, and dibutyltin dioctoate; titanates and titanium chelates such as tetraisopropoxytitanium, tetra-n-butoxytitanium, tetrakis(2-ethylhexoxy)titanium, dipropoxybis(acetylacetonato)titanium, and titanium isopropoxyoctylene glycol; organometallic compounds such as zinc naphthenate, zinc stearate, zinc 2-ethyloctoate, iron 2-ethylhexoate, cobalt 2-ethylhexoate, manganese 2-ethylhexoate, cobalt naphthenate, and alkoxyaluminum compounds; quaternary ammonium salts such as benzyltriethylammonium acetate; alkali metal salts of lower fatty acids such as potassium acetate, sodium acetate and lithium oxalate; guanidyl-containing silanes or siloxanes such as tetramethylguanidylpropyltrimethoxysilane, tetramethylguanidylpropylmethyldimethoxysilane and tetramethylguanidylpropyltris(trimethylsiloxy)silane, and mixtures comprising one or more of the foregoing. Typically the cure catalyst is used in an amount of 0 to 10 parts by weight, preferably 0.01 to 5 parts by weight per 100 parts by weight of component (A).

Filler

In the RTV silicone rubber composition of the invention, a variety of fillers may be compounded if desired. Suitable fillers include finely divided silica, silica aerogel, precipitated silica, diatomaceous earth, metal oxides such as iron oxide, titanium oxide, and aluminum oxide, metal nitrides such as boron nitride and aluminum nitride, metal carbonates such as calcium carbonate, magnesium carbonate and zinc carbonate, asbestos, glass wool, carbon black, powdered mica, powdered fused silica, powdered synthetic resins such as polystyrene, polyvinyl chloride, and polypropylene, and the like. These fillers may be compounded in any desired amount that does not adversely affect the objects of the invention. Preferably the fillers are previously dried to remove water prior to use.

Additives

Optionally, a variety of additives may be added to the RTV silicone rubber composition of the invention. Suitable additives include thixotropic agents such as polyethers, mildew-proof agents, fungicidal agents, and adhesion promoters such as epoxysilanes including γ-glycidoxypropyltrimethoxysilane and β- (3,4-epoxycyclohexyl)ethyltrimethoxysilane. Also optionally, pigments, dyes, antioxidants, stabilizers, antistatic agents, and flame retardants such as antimony oxide and chlorinated paraffins may be added.

Preparation

The RTV silicone rubber composition of the invention may be prepared by combining components (A) to (C) and optionally the cure catalyst, filler and additives, and intimately mixing them in a dry atmosphere. The composition remains stable in the sealed state, but cures quickly by moisture when it is exposed to air. If necessary, a suitable diluent selected from hydrocarbon solvents such as toluene and petroleum ether, ketones and esters may be added to the composition before it is applied.

Absent the diluent, the silicone rubber composition of the invention preferably has a viscosity at 23° C. of less than or equal to 300 Pa-s, more preferably less than or equal to 200 Pa-s, and most preferably less than or equal to 100 Pa-s.

The silicone rubber composition of the invention is used for the protection of electric and electronic parts. By any standard technique, electric and electronic parts are encapsulated, sealed or coated with the composition. The preferred electric and electronic parts to which the composition is applicable include those parts having a metal portion, especially a copper or silver portion on at least a part of their surface, typically circuit boards having electric and electronic parts (which need not have a metal portion on their surface) mounted thereon, silver electrodes and silver chip resistors.

EXAMPLE

Examples of the invention are given below by way of illustration and not by way of limitation. Note that all parts are by weight, and the viscosity is a measurement at 23° C. by a rotary viscometer.

Examples 1-3 & Comparative Examples 1-4

Compositions were prepared by mixing 100 parts of a dimethylpolysiloxane capped with hydroxyl groups at opposite ends of its molecular chain having a viscosity of 700 mPa-s (23° C.) as component (A) and 20 parts of a dimethylpolysiloxane capped with methyl groups at opposite ends of its molecular chain having a viscosity of 300 mPa-s (23° C.) in a Shinagawa compounder at room temperature for 20 minutes, adding thereto 8 parts of phenyltri(isopropenyloxy)silane as component (B), 1 part of 1,1,3,3-tetramethyl-2-[3-(trimethoxysilyl)propyl]guanidine as a cure catalyst, and an amount of an amino-bearing compound, shown in Table 1, as component (C) or comparative component or 1 part of copper powder in a dry state, and mixing them for 20 minutes while deaerating.

TABLE 1

| Example | Component (C), amount | Comparative component, amount |
|---|---|---|
| Example 1 | N-(2-aminoethyl)-3-aminopropyl-trimethoxysilane, 1 pbw | |
| Example 2 | N'-[3-(trimethoxysilyl)-propyl]-diethylenetriamine, 1 pbw | |

TABLE 1-continued

| Example | Component (C), amount | Comparative component, amount |
|---|---|---|
| Example 3 | tris(2-aminoethyl)amine, 1 pbw | |
| Comparative Example 1 | | pyridine, 1 pbw |
| Comparative Example 2 | N-(2-aminoethyl)-3-aminopropyl-trimethoxysilane, 0.05 pbw | |
| Comparative Example 3 | | benzotriazole, 1 pbw |
| Comparative Example 4 | | copper powder, 1 pbw |

Examples 4-6 & Comparative Examples 5-6

Compositions were prepared by mixing 100 parts of a dimethylpolysiloxane capped with hydroxyl groups at opposite 15 ends of its molecular chain having a viscosity of 700 mPa-s (23° C.) as component (A) and 60 parts of crystalline silica in a Shinagawa compounder at room temperature for 20 minutes, adding thereto 8 parts of phenyltri(isopropenyloxy)silane as component (B), 1.4 parts of 1,1,3,3-tetramethyl-2-[3-(trimethoxysilyl)propyl]guanidine as a cure catalyst, and 1 part of an amino-bearing compound, shown in Table 2, as component (C) or comparative component or 1 part of copper powder in a dry state, and mixing them for 20 minutes while deaerating.

TABLE 2

| Example | Component (C), amount | Comparative component, amount |
|---|---|---|
| Example 4 | N-(2-aminoethyl)-3-aminopropyl-trimethoxysilane, 1 pbw | |
| Example 5 | N'-[3-(trimethoxysilyl)-propyl]-diethylenetriamine, 1 pbw | |
| Example 6 | tris(2-aminoethyl)amine, 1 pbw | |
| Comparative Example 5 | | pyridine, 1 pbw |
| Comparative Example 6 | | copper powder, 1 pbw |

Example 7 & Comparative Example 7

Compositions were prepared by mixing 100 parts of a dimethylpolysiloxane capped with trimethoxy groups at opposite ends of its molecular chain having a viscosity of 900 mPa-s (23° C.) as component (A) and 20 parts of a dimethylpolysiloxane capped with methyl groups at opposite ends of its molecular chain having a viscosity of 300 mPa-s (231° C.) in a Shinagawa compounder at room temperature for 20 minutes, adding thereto 7 parts of methyltrimethoxysilane as component (B), 2 parts of titanium chelate catalyst Orgatics TC-750 (trade name, Matsumoto Trading Co., Ltd.) as a cure catalyst, and 1 part of an amino-bearing compound, shown in Table 3, as component (C) or comparative component in a dry state, and mixing them for 20 minutes while deaerating.

TABLE 3

| Example | Component (C), amount | Comparative component, amount |
|---|---|---|
| Example 7 | N-(2-aminoethyl)-3-aminopropyl-trimethoxysilane, 1 pbw | |
| Comparative Example 7 | | pyridine, 1 pbw |

Comparative Example 8

A composition was prepared by mixing 100 parts of a dimethylpolysiloxane capped with hydroxyl groups at opposite ends of its molecular chain having a viscosity of 700 mPa-s (23° C.) as component (A) and 20 parts of a dimethylpolysiloxane capped with methyl groups at opposite ends of its molecular chain having a viscosity of 300 mPa-s (23° C.) in a Shinagawa compounder at room temperature for 20 minutes, adding thereto 8 parts of phenyltri(isopropenyloxy)silane as component (B) and 1 part of 1,1,3,3-tetramethyl-2-[3-(trimethoxysilyl)propyl]guanidine as a cure catalyst in a dry state, and mixing them for 20 minutes while deaerating.

TABLE 4

| Example | Component (C), amount |
| --- | --- |
| Comparative Example 8 | — |

Cure Test

Each of the compositions prepared in Examples 1-7 and Comparative Examples 1-8 was exposed to a 23° C./50% RH atmosphere and held for 20 minutes. It was then observed whether the surface of each composition had cured. The cured sample was marked "○" and the uncured sample marked "X". The results are shown in Table 5.

Corrosion Test

On a silver-plated iron strip, each of the compositions prepared in Examples 1-7 and Comparative Examples 1-8 was coated to a thickness of 2 mm and cured to form a test sample. The sample was placed in a 100-ml glass bottle together with 0.2 g of sulfur powder. The bottle was closed and heated at 80° C. for 100 hours. Thereafter, the cured composition was stripped from the sample to visually examine the degree of corrosion on the silver plating. The sample was rated "⊙" for no corrosion, "○" for little corrosion, and "X" for corrosion observed as blackening. The results are shown in Table 5.

Storage Test

Storage stability was examined by placing each of the compositions prepared in Examples 1-7 and Comparative Examples 1-8 in a 100-ml glass bottle, and holding at 23° C. for 1,000 hours. The sample was then observed for separation of the silicone composition or precipitation and separation of components. The sample was rated "○" when unchanged, and "X" when precipitated and separated. The results are shown in Table 5.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A room temperature-curable silicone rubber composition for electric and electronic part protection comprising:
   (A) 100 parts by weight of an organopolysiloxane of formula (1):

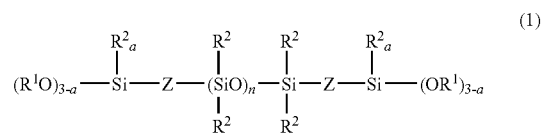

wherein
   $R^1$ is hydrogen or a substituted or unsubstituted monovalent hydrocarbon group,
   $R^2$ is a substituted or unsubstituted monovalent hydrocarbon group,
   Z is an oxygen atom or divalent hydrocarbon group,
   a is 0, 1 or 2, and
   n is an integer of at least 10,
   (B) 1 to 50 parts by weight of an organosilicon compound of formula:

$R^3_b SiX_{4-b}$ wherein
   $R^3$ is substituted or unsubstituted monovalent hydrocarbon group,
   X is a hydrolyzable group, and
   b is 0, 1 or 2,
   or a partial hydrolytic condensate thereof, and
   (C) 0.1 to 20 parts by weight of at least one non-aromatic amino-bearing compound selected from the group consisting of
   propanediamine,
   1,2-diaminocyclohexane,
   N'-[3-(trimethoxysilyl)-propyl]diethylenetriamine, and
   tris(2-aminoethyl)amine.

2. A circuit board having mounted thereon an electric or electronic part encapsulated with the silicone rubber composition of claim 1 in the cured state.

TABLE 5

|  | Example | | | | | | | Comparative Example | | | | | | | |
| --- | --- | --- | --- | --- | --- | --- | --- | --- | --- | --- | --- | --- | --- | --- | --- |
|  | 1 | 2 | 3 | 4 | 5 | 6 | 7 | 1 | 2 | 3 | 4 | 5 | 6 | 7 | 8 |
| Cure test | ○ | ○ | ○ | ○ | ○ | ○ | ○ | ○ | ○ | ○ | ○ | ○ | ○ | ○ | ○ |
| Corrosion test | ○ | ⊙ | ⊙ | ○ | ⊙ | ⊙ | ○ | X | X | X | ○ | X | ○ | X | X |
| Storage test | ○ | ○ | ○ | ○ | ○ | ○ | ○ | ○ | ○ | ○ | X | ○ | X | ○ | ○ |

The data demonstrate that silicone compositions free of component (C) (Comparative Examples 1-3, 5, 7, 8) could not prevent corrosion of silver plating, and silicone compositions using copper powder (Comparative Examples 4 and 6) were low in storage stability. In contrast, silicone compositions containing component (C) (Examples 1-7) prevented corrosion of silver plating and remained stable during storage.

Japanese Patent Application No. 2005-141131 is incorporated herein by reference.

3. A silver electrode sealed with the silicone rubber composition of claim 1 in the cured state.

4. A silver chip resistor sealed with the silicone rubber composition of claim 1 in the cured state.

5. The composition of claim 1, which further comprises 0.01 to 10 parts by weight of at least one cure catalyst.

6. The composition of claim 5, wherein the cure catalyst comprises at least one selected from the group consisting of dibutyltin diacetate, dibutyltin dilaurate, dibutyltin dioctoate, tetraisopropoxytitanium, tetra-n-butoxytitanium, tetrakis(2-ethylhexoxy)titanium, dipropoxybis (acetylacetonato)-titanium, titanium isopropoxyoctylene glycol, zinc naphthenate, zinc stearate, zinc 2-ethyloctoate, iron 2-ethylhexoate, cobalt 2-ethylhexoate, manganese 2-ethylhexoate, cobalt naphthenate, an alkoxyaluminum compound, benzyltriethylammonium acetate, potassium acetate, sodium acetate, lithium oxalate, tetramethylguanidylpropyltrimethoxysilane, tetramethylguanidylpropylmethyldimethoxysilane, and tetramethylguanidylpropyltris(trimethylsiloxy)silane.

7. The composition of claim 1, wherein component (C) is N'-[3-(trimethoxysilyl)-propyl]diethylenetriamine.

8. The composition of claim 1, exhibiting a viscosity of no more than 300 Pa·s at 23° C.

9. The composition of claim 1, exhibiting a viscosity of no more than 200 Pa·s at 23° C.

10. The composition of claim 1, exhibiting a viscosity of no more than 100 Pa·s at 23° C.

11. The composition of claim 1, comprising 3 to 20 parts by weight of said component (B).

12. The composition according to claim 1, wherein a is 0 or 1 and $R^1$ is at least one selected from the group consisting of a methyl group and an ethyl group.

13. The composition according to claim 1, wherein a is 2 and $R^1$ is hydrogen.

14. The composition according to claim 1, wherein $R^2$ is at least one selected from the group consisting of methyl, ethyl, propyl, isopropyl, butyl, 2-ethylbutyl, octyl, cyclohexyl, cyclopentyl, vinyl, allyl, phenyl, tolyl, xylyl, naphthyl, biphenylyl, phenanthryl, benzyl, phenylethyl, chloromethyl, trichloropropyl, trifluoropropyl, bromophenyl, chlorocyclohexyl, 2-cyanoethyl, 3-cyanopropyl, and 2-cyanobutyl.

15. The composition according to claim 1, wherein $R^2$ is at least one selected from the group consisting of methyl, vinyl, phenyl, and trifluoropropyl.

16. The composition according to claim 1, further comprising at least one adhesion promoter selected from the group consisting of γ-glycidoxypropyl-trimethoxysilane and β-(3,4-epoxycyclohexyl)ethyltrimethoxysilane.

* * * * *